United States Patent
Wheaton et al.

(10) Patent No.: US 11,514,622 B2
(45) Date of Patent: Nov. 29, 2022

(54) SYSTEM, APPARATUS, AND METHOD FOR INCREMENTAL MOTION CORRECTION IN MAGNETIC RESONANCE IMAGING

(71) Applicant: CANON MEDICAL SYSTEMS CORPORATION, Otawara (JP)

(72) Inventors: Andrew J. Wheaton, Vernon Hill, IL (US); Anuj Sharma, Vernon Hill, IL (US); Samir Dev Sharma, Vernon Hill, IL (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 190 days.

(21) Appl. No.: 17/110,077

(22) Filed: Dec. 2, 2020

(65) Prior Publication Data
US 2022/0172410 A1   Jun. 2, 2022

(51) Int. Cl.
*G06T 11/00* (2006.01)
*G01R 33/565* (2006.01)
*G01R 33/48* (2006.01)
*G01R 33/56* (2006.01)

(52) U.S. Cl.
CPC ........ *G06T 11/005* (2013.01); *G01R 33/4818* (2013.01); *G01R 33/5608* (2013.01); *G01R 33/56509* (2013.01); *G06T 2210/41* (2013.01)

(58) Field of Classification Search
None
See application file for complete search history.

(56) References Cited

U.S. PATENT DOCUMENTS

| 2007/0287907 A1* | 12/2007 | Spincemaille | G01R 33/5673 600/413 |
| 2008/0054899 A1 | 3/2008 | Aksoy et al. | |
| 2016/0003928 A1* | 1/2016 | Chen | G01R 33/4822 324/309 |

(Continued)

FOREIGN PATENT DOCUMENTS

WO   WO 2012/011069 A1   1/2012

OTHER PUBLICATIONS

MRI Artifacts and Correction Strategies, Smith et al., 10.2217/IIM. 10.33 © 2010 Future Medicine Ltd . . . Imaging Med. (2010) 2(4), 445-457 (13 pages).

(Continued)

*Primary Examiner* — Rodney E Fuller
(74) *Attorney, Agent, or Firm* — Oblon, McClelland, Maier & Neustadt, L.L.P.

(57) ABSTRACT

An apparatus for incremental motion correction in medical imaging. The apparatus for motion correction in magnetic resonance imaging includes processing circuitry configured to estimate an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion, estimate motion parameters of a second section of the k-space using the estimated intermediate image, combine data from the first section of the k-space with data from the second section of the k-space according to the estimated motion parameters, and reconstruct the combined data of the k-space to generate a final image.

20 Claims, 12 Drawing Sheets

(56) References Cited

U.S. PATENT DOCUMENTS

2017/0285125 A1 10/2017 Daniel et al.
2020/0341101 A1* 10/2020 Splitthoff ......... G01R 33/56509

OTHER PUBLICATIONS

Network Accelerated Motion Estimation and Reduction (NAMER): Convoiutional neural network guided retrospective motion: correction using a separable motion model; Melissa w. Haskell et al.; Magnetic Resonance in Medicine 2019; 1-10 (10 pages).

XD-GRASP: Golden-Angle Radial MRI with Reconstruction of Extra Motion-State Dimensions Using Corrpressed Sensing; Li Feng et al.; Magna Reson Med. Feb. 2016; 75(2): 775-788: doi:10.1002/mrm.25665 (25 pages).

Toward Quantifying the Prevalence, Severity and Cost Associated With Patient Motion During Clinical MR Examinations; Jada B. Andre, MD et al.; © 2015 American College of Radiology (8 pages).

Journal of Magnetic Resonance Imaging 11:174-181 (2000); Image Metric-Based Correction (Autocorrection) of Motion Effects: Analysis of Image Metrics; Kiaran P. McGee, PhD. et al.; © 2000 Wiley-Liss, Inc. (8 pages).

Magnetic Resonance in Medicine 63:91-105 (2010); PROMO: Real-Time Prospective Motion Correction in MRI Using Image-Based Tracking; Nathan White et al.; © 2009 Wiley-Liss, Inc. (15 pages).

Magnetic Resonance in Medicine 69:621-636 (2013); Prospective Motion Correction in Brain Imaging: A Review; Julian Maclaren et al.; © 2012 Wiley Periodicals, Inc. (16 pages).

Magnetic Resonance in Medicine 64:157-166 (2010); Data Convolution and Combination Operation (COCOA) for Motion Ghost Artifacts Reduction; Feng Huang et al.; © 2010 Wiley-Liss, Inc. (10 pages).

IEEE Transactions on Medical Imaging, vol. 37, No. 5, May 2018; Targeted Motion Estimation and Reduction (TAMER): Data Consistency Based Motion Mitigation for MRI Using a Reduced Model Joint Optimization, Melissa W. Haskell, et al.; © 2018 IEEE, (13 pages).

* cited by examiner

SYSTEM, APPARATUS, AND METHOD FOR INCREMENTAL MOTION CORRECTION IN MAGNETIC RESONANCE IMAGING

BACKGROUND

Field of the Disclosure

The present disclosure relates to motion correction in medical imaging. In particular, the present disclosure relates to motion correction in magnetic resonance imaging.

Description of the Related Art

Medical imaging generates images of internal organs and tissues of a patient's body. For example, magnetic resonance imaging (MRI) uses radio waves, magnetic fields, and magnetic-field gradients to generate images of internal organs and tissues. Once these images have been generated, a physician can use the images for diagnosing patient injuries or diseases.

The diagnostic quality of images, however, can be greatly reduced by motion. Motion, which may be a result of the inability of a patient to remain still, presents a major challenge in MRI, in particular. In certain cases, motion can render an image non-diagnostic. In one analysis, it was found that as many as 15.4% of head and neck scans need to be repeated due to motion. In another analysis, 55 of 175 imaging examinations show some evidence of motion, 29 examinations thereof including at least one repeated sequence. Repeated sequences can be financially and temporally costly for the patient, the operator, and the hospital.

Moreover, efforts to account for the above-described motion are typically inadequate. For instance, such techniques often result in either low diagnostic quality images or require time-intensive processes that render the approach of little use in clinical settings. Considering further that motion can have an outsized impact on patients suffering from movement disorders, which may lead to the inability to provide effective medical care to these patients, a new approach to motion correction is needed for medical imaging.

The foregoing "Background" description is for the purpose of generally presenting the context of the disclosure. Work of the inventors, to the extent it is described in this background section, as well as aspects of the description which may not otherwise qualify as prior art at the time of filing, are neither expressly or impliedly admitted as prior art against the present invention.

SUMMARY

The present disclosure relates to incremental motion correction in medical imaging.

According to an embodiment, an apparatus for incremental motion correction in magnetic resonance imaging, the apparatus comprising processing circuitry configured to estimate an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion, estimate motion parameters of a second section of the k-space using the estimated intermediate image, combine data from the first section of the k-space with data from the second section of the k-space according to the estimated motion parameters, and reconstruct the combined data of the k-space to generate a final image.

According to an embodiment, the present disclosure further relates to a method for incremental motion correction in magnetic resonance imaging, comprising estimating, by processing circuitry, an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion, estimating, by the processing circuitry, motion parameters of a second section of the k-space using the estimated intermediate image, combining, by the processing circuitry, data from the first section of the k-space with data from the second section of the k-space according to the estimated motion parameters, and reconstructing, by the processing circuitry, the combined data of the k-space to generate a final image.

According to an embodiment, the present disclosure further relates to a non-transitory computer-readable storage medium storing computer-readable instructions that, when executed by a computer, cause the computer to perform a method for incremental motion correction in magnetic resonance imaging, comprising estimating an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion, estimating motion parameters of a second section of the k-space using the estimated intermediate image, combining data from the first section of the k-space with data from the second section of the k-space according to the estimated motion parameters, and reconstructing the combined data of the k-space to generate a final image.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
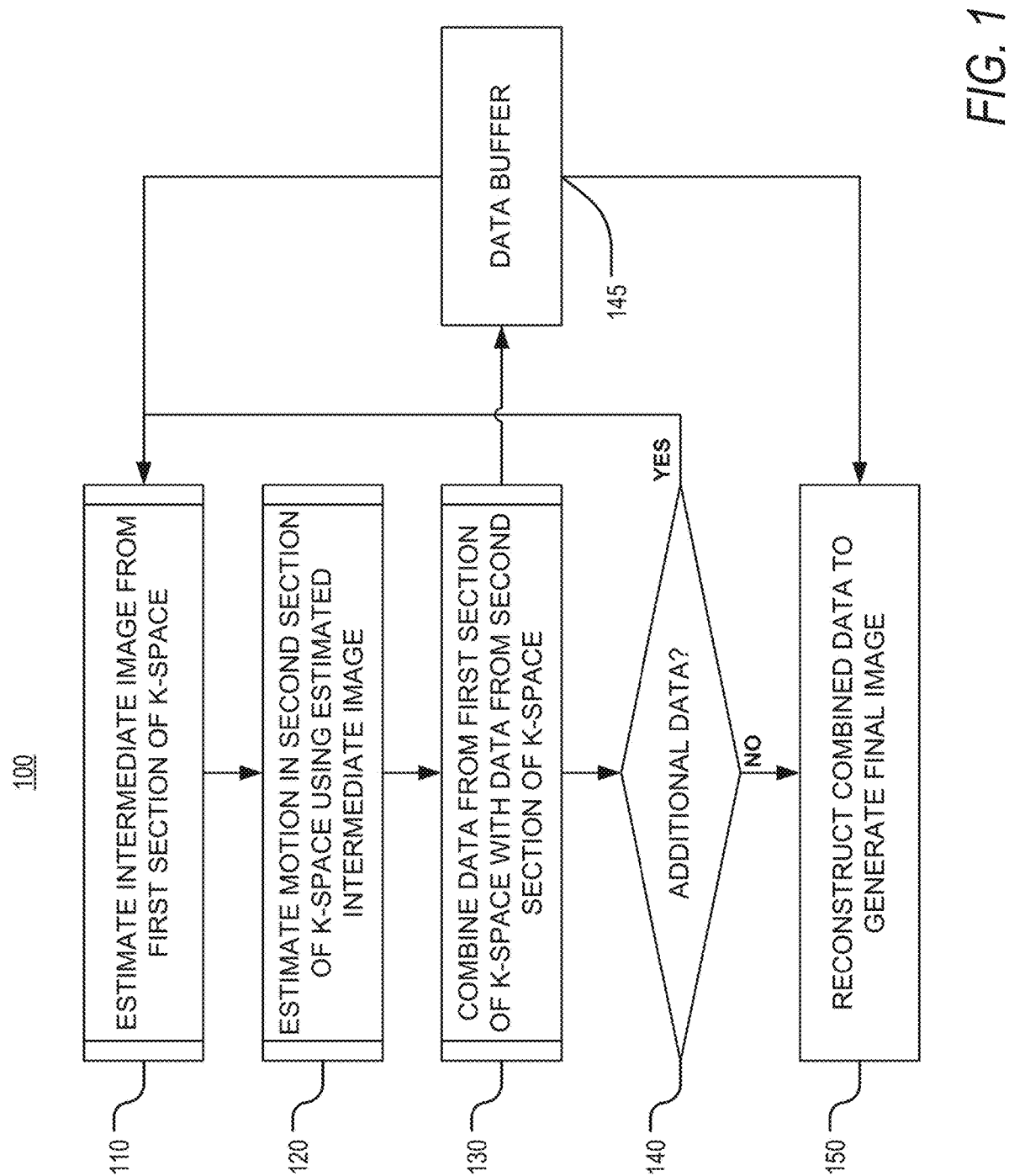
FIG. 1 is a flow diagram of a method for incremental motion correction, according to an exemplary embodiment of the present disclosure.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The exemplary embodiments are described in the context of methods having certain steps. However, the methods and compositions operate effectively with additional steps and steps in different orders that are not inconsistent with the exemplary embodiments. Thus, the present disclosure is not intended to be limited to the embodiments shown, but is to be accorded the widest scope consistent with the principles and features described herein and as limited only by the appended claims.

Furthermore, where a range of values is provided, it is to be understood that each intervening value between an upper and lower limit of the range—and any other stated or intervening value in that stated range—is encompassed within the disclosure. Where the stated range includes upper and lower limits, ranges excluding either of those limits are also included. Unless expressly stated, the terms used herein are intended to have the plain and ordinary meaning as understood by those of ordinary skill in the art. Any definitions are intended to aid the reader in understanding the present disclosure, but are not intended to vary or otherwise limit the meaning of such terms unless specifically indicated.

In the case of patients that suffer from movement disorders, or neurologic conditions that affect movement, medical imaging can be problematic. For these patients, who may suffer from ataxia, dystonia, Huntington's disease, Parkinson's disease, Tourette syndrome, and tremors, among others, and for patients who are generally restless, the physical stillness required of many imaging modalities is all but impossible. As a result, images resulting therefrom often exhibit greatly reduced diagnostic quality, as the ability to account for patient motion is insufficient or time-intensive enough that it is impractical.

To this end, motion from a patient, or other object, during a magnetic resonance (MR) scan, for instance, can introduce artifacts in reconstructed images (e.g., blurring, ghosting, signal loss, etc.), which may lead to misdiagnosis or repetitive imaging in an effort to mitigate motion errors. While certain motion can be accounted for, to an extent, certain patients, such as those described above who suffer neurologic conditions, cannot control limb movements sufficiently to allow for motionless imaging, thereby introducing a sporadic motion factor into the MR scan task.

As background, it should be appreciated that MRI systems do not acquire data directly in image-space, but rather, in the frequency or Fourier space. Motion artifacts can materialize in a scan due to myriad factors including, other than patient motion, the image structure, type of motion, MR pulse sequence settings, and k-space acquisition strategy. The center of k-space contains low spatial frequency information correlated to objects with large, low contrast features and smooth intensity variations, whereas the periphery of k-space contains high spatial frequency information correlated to edges, details, and sharp transitions. A majority of biological samples show very local spectral density in k-space centered around k=0. The $k_x$ and $k_y$ axes of k-space correspond to the horizontal (x-) and vertical (y-) axes of a two-dimensional (2D) image. The k-axes, however, represent spatial frequencies in the x- and y-directions rather than positions. For a three-dimensional (3D) image volume, the $k_Y$ axis is also sampled, corresponding to a slice dimension of the image volume. Since the object in k-space is described by global planar waves, each point in k-space contains spatial frequency and phase information about every pixel in the final image. Conversely, each pixel in the image maps to every point in k-space. Simple reconstruction using an inverse FFT (iFFT) assumes the object has remained stationary during the time the k-space data were sampled. Therefore, errors from object motion have a pronounced effect on the final reconstructed image because a change in a single sample in k-space can affect the entire image. Since scan durations can take minutes in order to acquire the data necessary for image reconstruction, attempts have been made to accelerate the imaging speed as well as to detect and correct for motion in images, as will be described herein.

Several approaches to avoiding or correcting motion artifacts in MRI have been previously implemented. These approaches can be generally defined as prospective motion correction methods and retrospective motion correction methods. Prospective motion correction methods can include continuous, or semi-continuous, measurement of patient motion in order to track a position of the patient over time and update acquisition parameters in anticipation of patient motion. Optical cameras deploying structured light and/or fiducial markers can be used. While prospective motion correction offers high accuracy and high temporal resolution, such approaches often require special hardware and calibration, making them expensive and difficult to consistently and accurately implement. Retrospective motion correction methods can include machine learning-based methods and non-machine learning-based methods. Typically, these techniques are based on radial acquisition methods, which force slow acquisition and result in limited contrast. Machine learning-based methods can include a combination of physics-based models and machine learning networks to solve for motion using data consistency measures. In this way, the machine learning network can provide a jump start on finding solutions to the set of motion parameters. However, the primary drawback of machine learning-based approaches to motion correction is the large parameter space to be solved. In most cases, this approach requires simultaneous solving of sets of motion parameters for each view, or shot, of the imaging space. For in-plane affine transformations, including two translations and one rotation, the number of independent parameters to be solved for can easily be approximately 100, accounting motion parameters and the number of shots. Thus, the size and complexity of this non-convex problem makes the solution slow and possibly unstable.

Accordingly, in an embodiment of the present disclosure, a method for the reduction of the parameter space to be solved is described. By solving for the motion parameter set one shot at a time, the size of the problem to be solved can be reduced from approximately 100 to 3. In an embodiment, this allows machine learning-based methods to be implemented.

In an embodiment of the present disclosure, the method includes, first, generating an initial 'clean image' comprising a subset of the total shots of an MR scan. The initial 'clean image', which reflects a minimal motion state of the patient, can be used in order to jump start future convergence calculations when new datasets are considered. The new datasets may be data from a single shot of k-space, the data from the single shot of k-space having comparable differences from the 'clean image' and thus allowing the datasets to be compared. In an embodiment, image quality (IQ) changes incrementally with small changes in acceleration factor (e.g., an acceleration factor, R, of 2.6 and 2.3 create very similar images). As new data is added to the intermediate image, the acceleration factor is slightly reduced.

Described differently, it can be assumed, in an example, that a first K seconds of an MRI acquisition are motion-free. For instance, it may be that a patient can maintain stillness for 10-30 seconds of the MRI acquisition. Data from a first M shots, corresponding to the first K seconds (e.g. 10-30 seconds), can be used to generate an initial 'clean image'. Of course, it can be appreciated that M can be easily adjusted as an operator parameter and based on assessment of 'motion risk' of the patient over time. As indicated, the M shots of k-space data can be used to reconstruct an image. Though not of a high quality, the image reconstructed from under-sampled k-space data is an intermediate image that can be used to establish a baseline for estimating motion parameters of a subsequent intermediate image and a final image. Using the intermediate image reconstructed from the M shots, a subsequent shot of data, or M+1 shot, can be considered and motion parameters thereof can be calculated using a motion estimation method. If the calculated motion parameters are too large, or the data between M shots and M+1 shot is deemed inconsistent beyond a threshold data consistency value, among other comparisons, data from the M+1 shot can be discarded. Otherwise, the data from the M+1 shot can be added to the data from the M shots and the motion parameters estimated for M+1 can be added to a vector of motion parameters describing the final image. After considering the data from the M+1 shot, and incorporating the data from the M+1 shot, as appropriate, a M+2 shot can be considered in the same way as the M+1 shot was considered and the above-described process can be repeated. The motion parameters within the vector of motion parameters can be used to generate a subsequent intermediate image as well as a final image, if no additional shots are to be considered.

Figure 7:
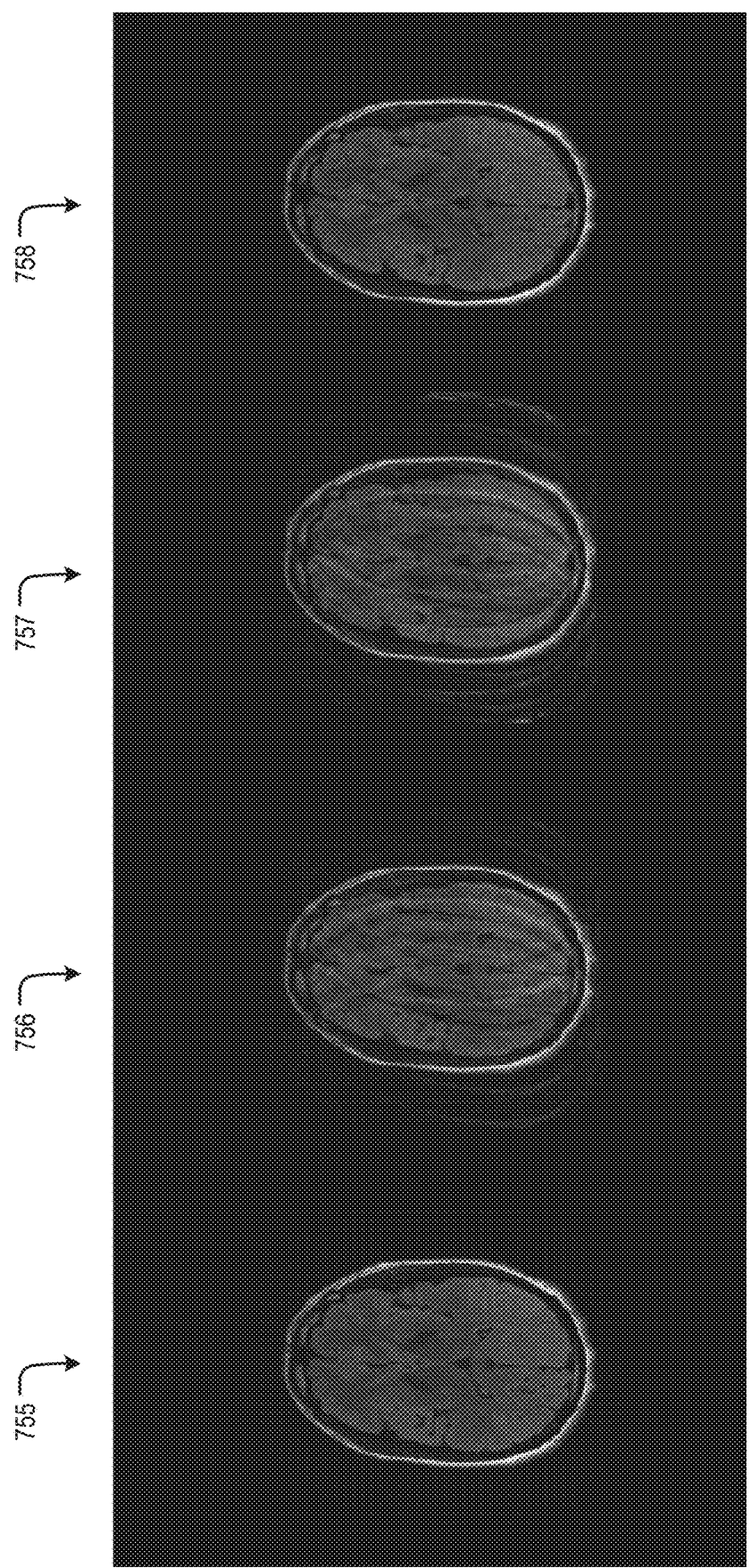
FIG. 7 is an illustration of an implementation of a method for incremental motion correction, according to an exemplary embodiment of the present disclosure.

In view of the above, it can be appreciated that creating an initial image using all shots of the k-space can lead to significant image artifacts, a result of including shots with significant motion (as shown in FIG. 7). On the other hand, creating an image with only one or a few motion free shots is likely insufficient, as an image reconstructed from such little data is likely to be of low quality. Thus, as herein, an intermediate image reconstructed from M shots will have greatly reduced motion when compared with an image generated from all shots of the k-space and the image will be derived from enough data such that it serves as a sufficient 'clean' image for estimating motion in future shots.

In an embodiment, minimal motion shots of the k-space may have zero motion. In another embodiment, minimal motion shots of the k-space may only have a small amount of motion when compared with other shots of the k-space. In this case, it can be understood that the minimal motion shots of the k-space have relatively zero motion.

To this end, "minimal motion" can be defined as shots of the k-space, within a k-space dataset, having the least amount of motion within the k-space dataset. In an example, the shots identified as being 'minimal motion' may have elevated levels of motion, considered absolutely, but may have 'minimal motion' when considered relative to other shots of the k-space dataset.

Of course, 'minimal motion' further depends upon scan condition and individual patient behavior. As described below with reference to FIG. 3A through FIG. 3D, 'minimal motion' could be determined by comparisons to threshold values or by evaluation of chronological acquisition of the MR scan.

In any event, it can be appreciated that the number of shots of the k-space selected to have 'minimal motion' should be sufficiently large to have enough data such that the first intermediate image constructed therefrom has adequate image quality to enable other methods to proceed.

In an embodiment, the initial 'clean image', or intermediate image, can be a reconstruction of the data from the identified minimal motion shots of the k-space and the vector of motion parameters. In an example, the reconstruction can be done by an accelerated image reconstruction method such as compressed sensing and parallel imaging. In another example, the reconstruction can be performed at one or more resolutions in order to expedite the method. The one or more resolutions may be achieved by eliminating data within shots of the k-space, as appropriate. Of course, it can be appreciated that machine learning-based reconstruction methods may also be used for speed.

In an embodiment, a final image, or the image generated after having considered and accounted for, or discarded, all shots of the k-space, can be reconstructed based on the vector of motion parameters and according to any type of reconstruction method. In an example, the reconstruction method may be the same as was used for the intermediate images or may be another method that provides higher quality images. In another example, the reconstruction may be performed at varying resolutions. For instance, the resolution of the final image reconstruction may be higher than the resolution of the intermediate image reconstructions, the lower resolution of the intermediate image reconstructions allowing for accelerated motion correction from shot to shot.

According to an embodiment, the methods of the present disclosure are not limited to using a first M shots, acquired chronologically, in order to generate an initial image estimate. The initial image estimated may be, instead, based on a minimization of a calculation of a motion metric for each shot within the k-space. Accordingly, the initial image estimate may be based on M shots of N total shots of the k-space having lowest motion, and the M shots may be acquired at any time within the MR scan.

According to an embodiment, methods of the present disclosure can be implemented as described below. First, a number of M shots needed to form an initial intermediate image can be calculated. The number of M shots can be based on a number of shots and an acceleration factor. In an example, the number of M shots can be selected in order to provide an acceleration factor, R, of between 3 and 4. Next, the N total shots of the k-space may be considered chronologically and the M shots may be selected therefrom. Alternatively, N total shots of the k-space can be sorted according to motion (or a motion score calculated for each shot). The M shots having the lowest motion can be selected to generate the initial intermediate image. The M shots with least motion can be selected using a k-space/image-space quantitative metric that can be used as a surrogate measure of motion. Motion parameters of a vector of motion parameters describing a final image can be updated based on this minimal motion reference frame.

In an embodiment, for shots M+1 to N total shots, motion within each shot can be estimated using a prior intermediate image. For instance, motion parameters of a $9^{th}$ shot of k-space can be estimated based on an intermediate image generated according to the first 8 evaluated shots of k-space. The motion parameters of the $9^{th}$ shot of k-space can then be included within the vector of motion parameters and used during intermediate image reconstruction and final image reconstruction to account for motion artifacts.

In an embodiment, final image estimation can be performed using data from the first section and subsequent sections deemed suitable, and the vector of motion parameters, using any desired reconstruction method.

Turning now to the Figures, the above-described methods will be generally described with respect to the flow diagram of FIG. 1. FIG. 1 describes method 100, an incremental motion correction method for medical imaging modalities, writ large, and MRI, in particular.

As indicated, in order to perform incremental motion correction, a first 'clean image' estimation needs to be generated on the basis of one or more shots of k-space data determined to be of minimal motion. Accordingly, at sub process 110 of method 100, an intermediate image can be estimated from a first section of k-space. The first section of k-space can be one or more shots, M, of k-space data from N total shots of the acquired k-space data of the MR scan. As will be described later, the first section of k-space can be selected according to acquisition time and or quality of the underlying shot data. The intermediate image of the first section of k-space can be reconstructed according to a reconstruction method. In a non-limiting example, the reconstruction method can be an accelerated image reconstruction method such as compressed sensing (CS) and parallel imaging (PI). In another example, the reconstruction method can be a machine learning-based reconstruction method that enhances speed in intermediate image reconstruction.

According to an exemplary embodiment, the intermediate image can be estimated by:

$$\hat{X}_M = \min_X \|A_M F S \hat{T}_{all} X - y_M\|_2^2 \quad (1)$$

where $y_M$ is the k-space data from first M shots selected as having minimal motion, $A_M$ is a sampling matrix for phase-encoding (PE) lines acquired in the first M shots, X represents the reconstructed image, S is the sensitivity maps of the receiver coils, F is the Fourier Transform operator, $\hat{T}_{all}$ is the estimated motion parameters for the shots of the N total shots of the k-space that are included in a final image, and $\hat{X}_M$, which is to be solved for, is the image estimated from the first M shots. Determination of which shots of the N total shots are included in the final image will be described later. The estimation of Equation (1) can be performed by, for instance, conjugate gradient-based sensitivity encoding (CG-SENSE) or another accelerated image reconstruction method.

Based on the initial M shots of the intermediate image, it can be appreciated that a vector comprising the motion parameters of a possible N total shots of the k-space included in the final image can be described as:

$$\hat{T}_{all} = [0, 0, \ldots, \hat{T}_i] \quad (2)$$

In an embodiment, motion parameters of the N total shots of the final image can include, in two-dimensional image-space, two translational components and one rotational component. In other embodiments, wherein additional dimensions of data are used (i.e. three-dimensional space), the motion parameters may be defined as having additional translational components and/or additional rotational components. Moreover, the motion parameters, as defined herein, should not be considered limiting, as any definition of motion parameters sufficient to allow motion correction within subsequent k-space data section could be implemented herein.

Having reconstructed an intermediate image at sub process 110, method 100 can proceed to sub process 120 where data from a second section of k-space can be evaluated for motion using the estimated intermediate image as a minimal motion reference. The second section of k-space may be one or more shots of k-space. In an example, the second section of k-space can be a next shot i of k-space data. Accordingly, motion parameters of the second section of k-space data can be estimated as $$\hat{T}_i = \min_T \|A_i F S \hat{X}_M - y_i\|_2^2 \quad (3)$$

where $y_i$ is the k-space data for the second section of k-space, or shot i, $A_i$ is the sampling matrix for PE lines acquired in shot i, T represents the matrix of motion parameters, and $\hat{T}_i$, which is to be solved for, is the estimated motion parameters for shot i (i.e., the second section of k-space). The estimation of Equation (3) can be performed by, for instance, Levenberg-Marquardt or another method such as Newton's.

At sub process 130 of method 100, the motion parameters estimated for the second section of k-space can be evaluated to determine if the second section of k-space should be added to the first section of k-space data that defines a final image. Moreover, the evaluation determines whether the estimated motion parameters should be included within the vector of motion parameters of the N total shots of the k-space, or $\hat{T}_{all}$. $\hat{T}_{all}$ may be stored in data buffer 145 and may be accessible to sub process 110 of method 100 and step 150 of method 100.

In determining the value of the second section of k-space, and as will be described with reference to FIG. 6, a data consistency metric may be a motion score calculated based on the estimation of the motion parameters of the second section of k-space. A value of the data consistency metric may be compared to an acceptability threshold and the data from the second section of k-space can be combined or rejected, as appropriate.

In an embodiment, and with the motion parameters for shot i estimated, $\hat{T}_i$ can be added to the vector of motion parameters ($\hat{T}_{all}$) so that it can be used during subsequent intermediate image reconstruction at sub process 110 of method 100 and final image reconstruction at step 150 of method 100.

Assuming the data of the second section of k-space is determined to be acceptable at sub process 130 of method 100, a combined dataset of k-space data may include the "motion corrected" data from the second section of k-space and the data from the first section of k-space. Thus, at step 140 of method 100, an evaluation can be made to determine if additional shots of the k-space should be considered. The evaluation can be (1) a determination of whether the number of evaluated shots is equal to the total number of shots of the k-space or, (2) a determination that no remaining shots of a ranked N total shots, the ranked N total shots having been ranked according to a motion score, will improve the quality of the final image. If it is determined at step 140 of method 100 that additional shots of the k-space should be evaluated, method 100 returns to sub process 110 and repeats with reconstruction of an intermediate image including the first section of k-space and the second section of k-space. A third section of k-space may then be considered. Alternatively, if it is determined at step 140 of method 100 that no additional shots of the ranked N total shots would improve the quality of the image, method 100 proceeds to step 150 wherein a final image of the combined data of the k-space is generated according to a final reconstruction method and using the vector of motion parameters stored in the data buffer 145. This may be the case, for instance, when, as is described with reference to FIG. 3B, the number of evaluated shots equals the N total shots of the k-space. In another instance, this may be the case if, as described in FIG. 3C, a next ranked shot of the N total shots is determined to not be able to improve the quality of the final image.

In an embodiment, the final reconstruction method may be the same as the iterative reconstruction method selected above or may be a different, higher quality reconstruction method to provide sufficiently diagnostic quality images. To this end, the iterative reconstruction methods and the final reconstruction methods may be performed at different resolutions and according to different techniques, based on constraints and goals at each step.

Figure 2:
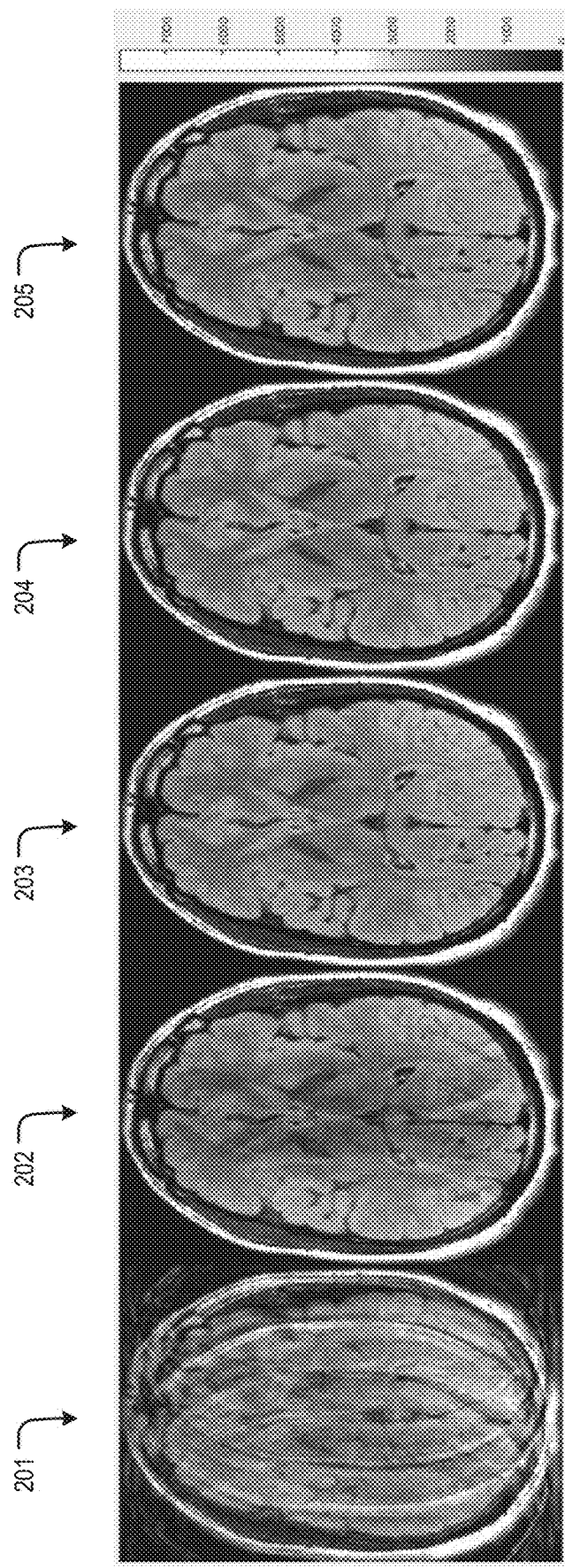
FIG. 2 is an illustration of an implementation of a method for incremental motion correction, according to an exemplary embodiment of the present disclosure.

The method described with reference to FIG. 1 will now be described with reference to the images of FIG. 2. FIG. 2 provides illustrations of a motion-corrupted image 201, an intermediate image including a first M shots of N total shots 202, an intermediate image including M+1 shots of the N total shots 203, an intermediate image including M+2 shots of the N total shots 204, and an intermediate image including M+3 shots of the N total shots 205. As additional shots are added, the image estimation via CG-SENSE is improved and acceleration factors are reduced. For instance, the acceleration factor for the intermediate image including the first M shots of the N total shots 202 has an acceleration factor of 4, the intermediate image including M+1 shots of the N total shots 203 has an acceleration factor of 3, the intermediate image including M+2 shots of the N total shots 204 has an acceleration factor of 2.4, and the intermediate image including M+3 shots of the N total shots 204 has an acceleration factor of 2. Moreover, the intermediate images are improved with the addition of additional, "motion-corrected" data from successive shots of the N total shots. For instance, estimated motion parameters for the intermediate image including M+3 shots of the N total shots 205 may be, within a PE translation vector, $\hat{T}_{all,PE}$=[0, 0, 0, −1.2960, −2.7992, −3.2990] millimeters. This can be compared with true motion parameter values for the intermediate image including M+3 shots of the N total shots 205, which include, described in the form of a PE translation vector, $T_{all,PE}$=[0, 0, 0, −1.3 −2.8, −3.3] millimeters. Similar vectors may be determined for rotation and for readout (RO) translation, the remaining motion parameters of the present disclosure, as described above.

Figure 3A:
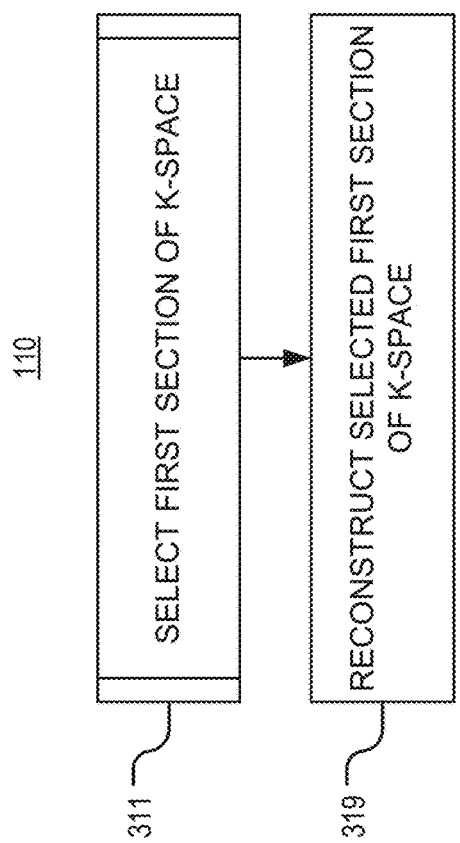
FIG. 3A is a flow diagram of a sub process of a method for incremental motion correction, according to an exemplary embodiment of the present disclosure.

Turning now to FIG. 3A, sub process 110 of method 100 will be further described. In order to estimate an intermediate image from a first section of k-space, it is necessary to first select a subset of the k-space as the first section of k-space. Accordingly, at sub process 311 of sub process 110, a subset of the k-space is selected as the first section of k-space. The selection can be based on calculated data consistency metrics, such as motion scores, and the like, or based on a chronological assessment of an MR scan. Notably, the first section of k-space is selected in order to minimize motion and develop a minimal motion reference as an intermediate image. Once the first section of k-space is selected at sub process 311 of sub process 110, a reconstruction of an intermediate image based on the first section of k-space can be performed at step 319 of sub process 110. This reconstruction can then be used at sub process 120 of method 100 to estimate motion parameters of a second section of k-space.

Different implementations of sub process 311 of sub process 110 will now be described with reference to FIG. 3B through FIG. 3D.

Figures 3B, 3C:
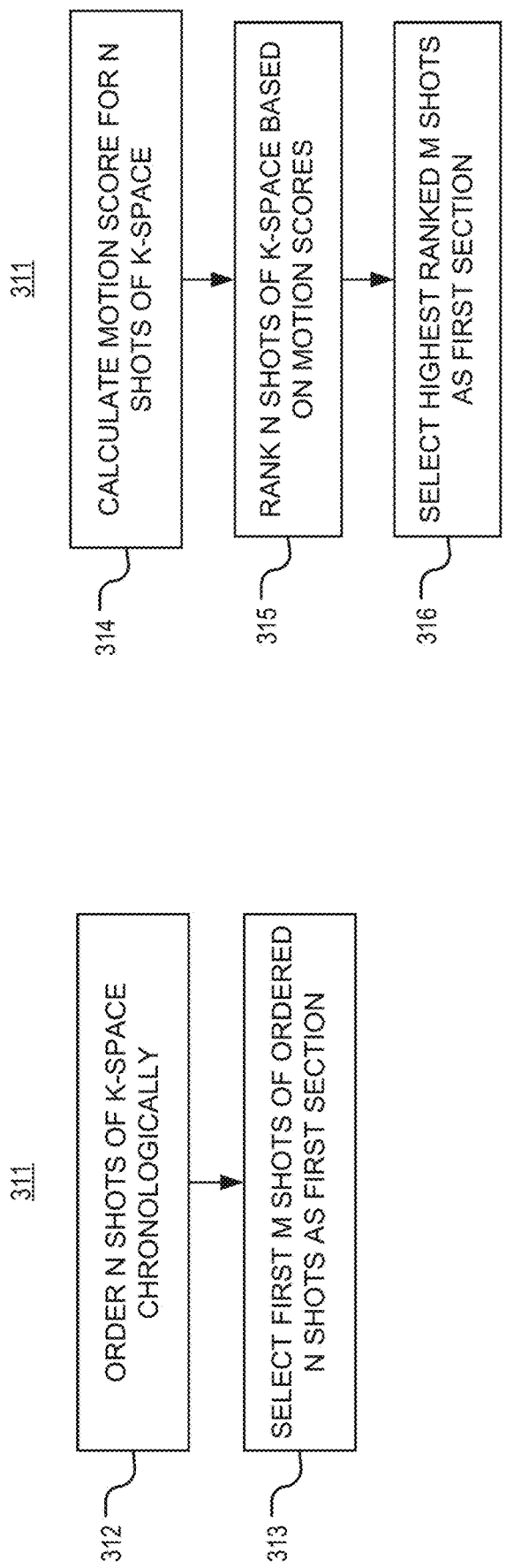
FIG. 3B is a flow diagram of a sub process of a method for incremental motion correction, according to an exemplary embodiment of the present disclosure.
FIG. 3C is a flow diagram of a sub process of a method for incremental motion correction, according to an exemplary embodiment of the present disclosure.
Figure 4A:
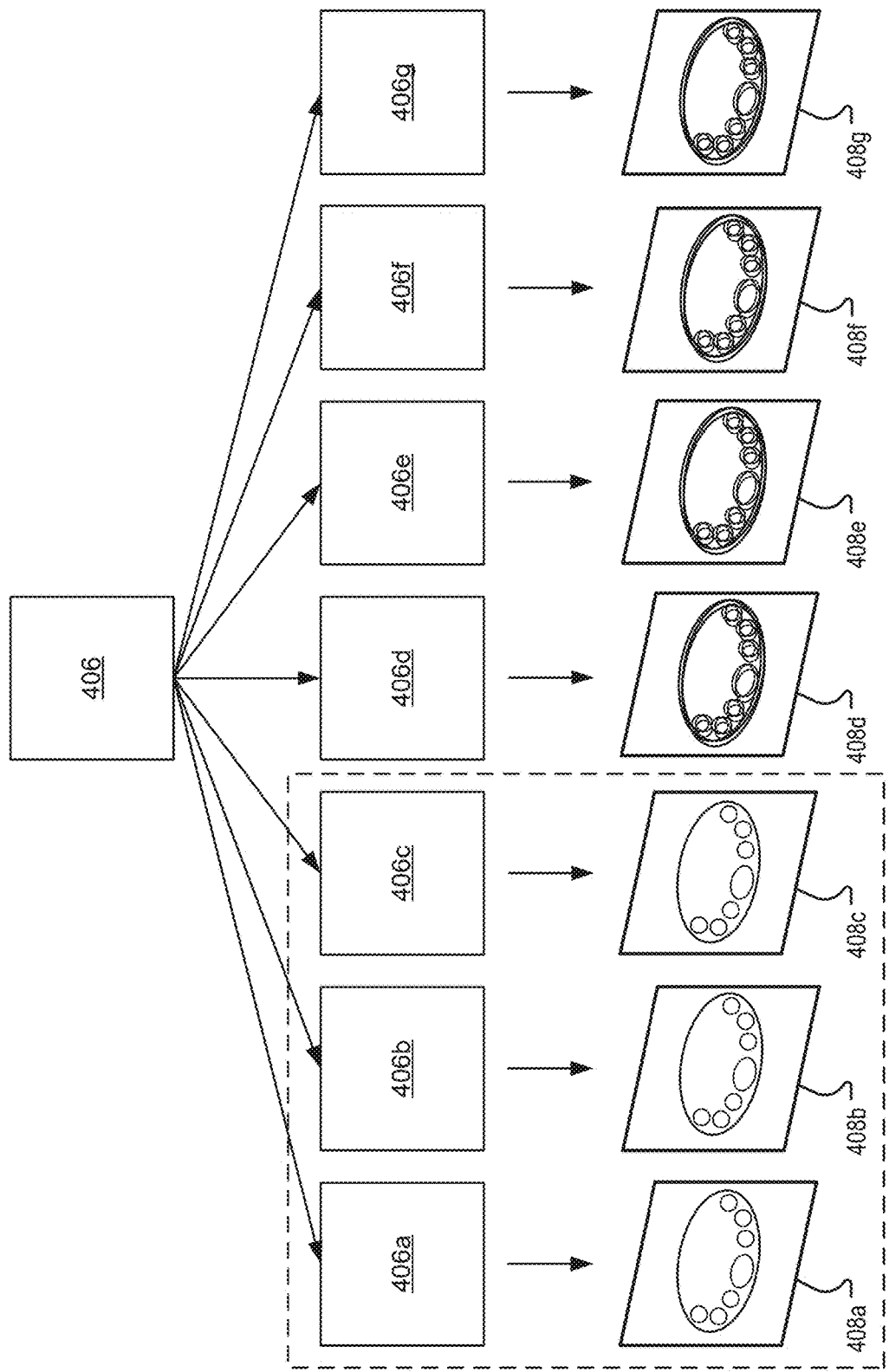
FIG. 4A is a schematic block diagram of a sub process of a method for incremental motion correction, according to an exemplary implementation of the present disclosure.

First, with reference to FIG. 3B, the first section of k-space can be selected according to a chronological ordering of the data. In other words, sub process 311 of sub process 110 can be performed under the assumption that a patient is still, or having minimal motion, for at least a first portion of a length of a MR scan. Thus, at step 312 of sub process 311, N total shots acquired during a MR scan can be ordered according to the time in which they were acquired. Shots acquired first, as shown in FIG. 4A, will be assumed to have minimal motion, as it is likely for the patient to remain still for a first period of time of the exam, corresponding to the first M shots of the N total shots. Therefore, at step 313 of sub process 311, the first M shots may be selected as the first section of k-space and may correspond to a subset of the ordered N total shots of the MR scan. The first section may be one or more shots of the k-space acquired during the MR scan and may correspond to, in an example, a first 20 seconds of acquisition during the MR scan.

In an embodiment, the first section of k-space may include one or more shots of the k-space determined to minimize a metric used as a direct measure of, or surrogate of, motion. To this end, a motion score may be calculated for each of N total shots of the k-space acquired during a MR scan. Then, the N total shots of the k-space may be evaluated, chronologically, according to respective motion scores. In this way, the first M shots of the N total shots may be the first L seconds of the MR scan wherein respective motion scores of the shots are within a predefined percentage (e.g. 1%, 2%, 3%, 5%, 7.5%, 10%, etc.) of a minimum motion score of the N total shots of the MR scan. In still another instance, the first M shots of the N total shots may be j seconds of the MR scan wherein respective motion scores of the shots have an average motion score within a predetermined percentage (e.g. 1%, 2%, 3%, 5%, 7.5%, 10%, etc.) of a minimal motion score. Of course, in any of the above instances, a quantity of the first M shots of the total N shots is variable according to motion of the patient during the MR scan.

In an embodiment, additional navigator data, generated by additional RF-pulses (e.g. spin echo or gradient echo), may be acquired with each shot. The navigator data can be used to determine respective motion scores for each shot of the N total shots of the k-space.

In an embodiment, motion scores may be determined by for each shot of the N total shots of the k-space by evaluating image gradient entropy of image-space transforms of each shot of the N total shots of the k-space. The images-space transforms may be low resolution transforms, in an example, so that a rough motion evaluation may be rapidly determined. In another embodiment, k-space-entropy may be used to determine motion scores for each shot of the N total shots of the k-space.

Of course, with reference to FIG. 3C, the first section of the k-space may be selected in other ways. For instance, with reference also to FIG. 4B, sub process 311 of sub process 110 may allow for selection of, as the first section of k-space, M shots of N total shots of the k-space that are determined to minimize a motion metric used as a direct measure of, or surrogate of, motion.

To this end, at step 314 of sub process 311, a motion score, similar to those described above, may be calculated for each of N total shots of the k-space acquired during a MR scan. Then, at step 315 of sub process 311, the N total shots of the k-space may be ranked according to respective motion scores calculated at step 314 of sub process 311. A number of methods for generating motion scores for the N total shots of the k-space may be deployed.

In an embodiment, additional navigator data, generated by additional RF-pulses (e.g. spin echo or gradient echo), may be acquired with each shot. The navigator data can be used to determine respective motion scores for each shot of the N total shots of the k-space.

In an embodiment, motion scores may be determined by for each shot of the N total shots of the k-space by evaluating image gradient entropy of image-space transforms of each shot of the N total shots of the k-space. The images-space transforms may be low resolution transforms, in an example, so that a rough motion evaluation may be rapidly determined. In another embodiment, k-space-entropy may be used to determine motion scores for each shot of the N total shots of the k-space.

At step 316 of sub process 311, the ranked N total shots of the k-space can be evaluated and M shots having lowest respective motion scores can be selected as the first section of k-space. The M shots may be, in an example, one or more shots of k-space. In an embodiment, the M shots of the first section of k-space may be shots of the k-space having respective motion scores that fall within a given deviation from a lowest respective motion score of the N total shots. Of course, other metrics and constraints may be used to define a shot of k-space without deviating from the spirit of the present disclosure.

In an embodiment, the M shots of the N total shots may be P ranked shots of the N total shots having respective motion scores within a predefined percentage (e.g. 1%, 2%, 3%, 5%, 7.5%, 10%, etc.) of a highest ranked (i.e., minimum motion score) shot of the N total shots of the MR scan. In still another instance, the M shots of the N total shots may be shots of the MR scan wherein respective motions scores of the shots have an average motion score within a predetermined percentage (e.g. 1%, 2%, 3%, 5%, 7.5%, 10%, etc.) of a highest ranked (i.e. minimum motion score) shot of the N total shots of the MR scan. Of course, in any of the above instances, a quantity of the M shots of the total N shots is variable according to motion of the patient during the MR scan.

Figure 3D:
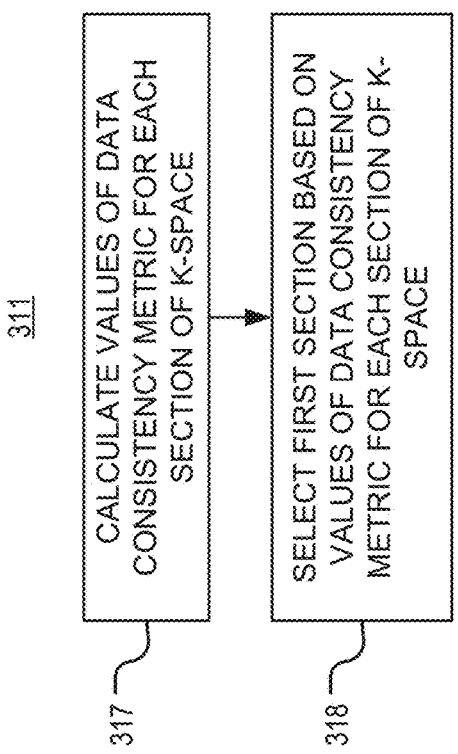
FIG. 3D is a flow diagram of a sub process of a method for incremental motion correction, according to an exemplary embodiment of the present disclosure.

Alternatively, and with reference now to FIG. 3D, a first section of k-space may be selected according to, as a data consistency metric, a data consistency error value. The data consistency error value may be calculated for each of the N total shots based on estimated motion parameters of each of the N total shots. Respective data consistency error values can then be evaluated and those having minimal data consistency error values, or having achieved data consistency error values within predefined ranges (i.e. <1%, <2%, <3%, <5%, <7.5%, <10%, etc.) of a minimal data consistency error value, can be selected, at step 318 of sub process 311, as the M shots of N total shots of k-space that are to be used as the first section of k-space.

In an embodiment, the data consistency error value reflects, for each shot of the N total shots, a difference between acquired shot data and data predicted by a forward model from an estimated intermediate image and motion. In other words, the data consistency error value can be equal to an error value from Equation (3) used to estimate motion for each shot of the N total shots.

In an embodiment, data consistency error values can be implemented within in a multi-resolution reconstruction method. For example, at a first resolution level, each of the N total shots may be "motion corrected" and a data consistency error value may be recorded. Subsequently, at a next resolution level, the M shots with lowest data consistency error values, calculated at the first resolution level, may be used to form the intermediate image and perform incremental correction, as described herein. In another embodiment, estimation at the first resolution level may be repeated with an intermediate image reconstructed from M shots having minimal data consistency error values following "motion correction" at the first resolution level.

The descriptions of FIG. 3B and FIG. 3C will now be further described with reference to the illustrations of FIG. 4A and FIG. 4B.

First, with respect to sub process 311 of FIG. 3B, FIG. 4A provides a schematic describing selection of M shots to be used as a first section of k-space, according to an exemplary embodiment of the present disclosure.

It can be appreciated that a MR scan, or a MR image dataset, can include a k-space 406 that comprises N total shots of k-space data. The k-space data of each of the N total shots, described in FIG. 4A as 406a-406g, are time-dependent signals acquired at different spatial frequencies in k-space. A Fourier transform, which may be a 2D Fourier transform, of the N total shots can be computed in order to produce corresponding grayscale images 408a-408g.

As shown in FIG. 4A, the dashed block indicates selection of a first 3 shots of chronologically-ordered N total shots, where N is 7. In proceeding with step 312 and step 313 of sub process 311, it can be appreciated that the patient may be able to remain still for a first 3 shots of k-space data, but that a remainder of the k-space data, or 4 shots, will be corrupted, to at least an extent, by patient motion. In an example, the first 3 shots of k-space data may have average motion scores within 1% of a shot of k-space data having a minimal motion score. Thus, as described with reference to FIG. 3B, a chronological ordering and selection of M shots of N total shots of k-space data, as the first section of k-space data, can be performed.

Figure 4B:
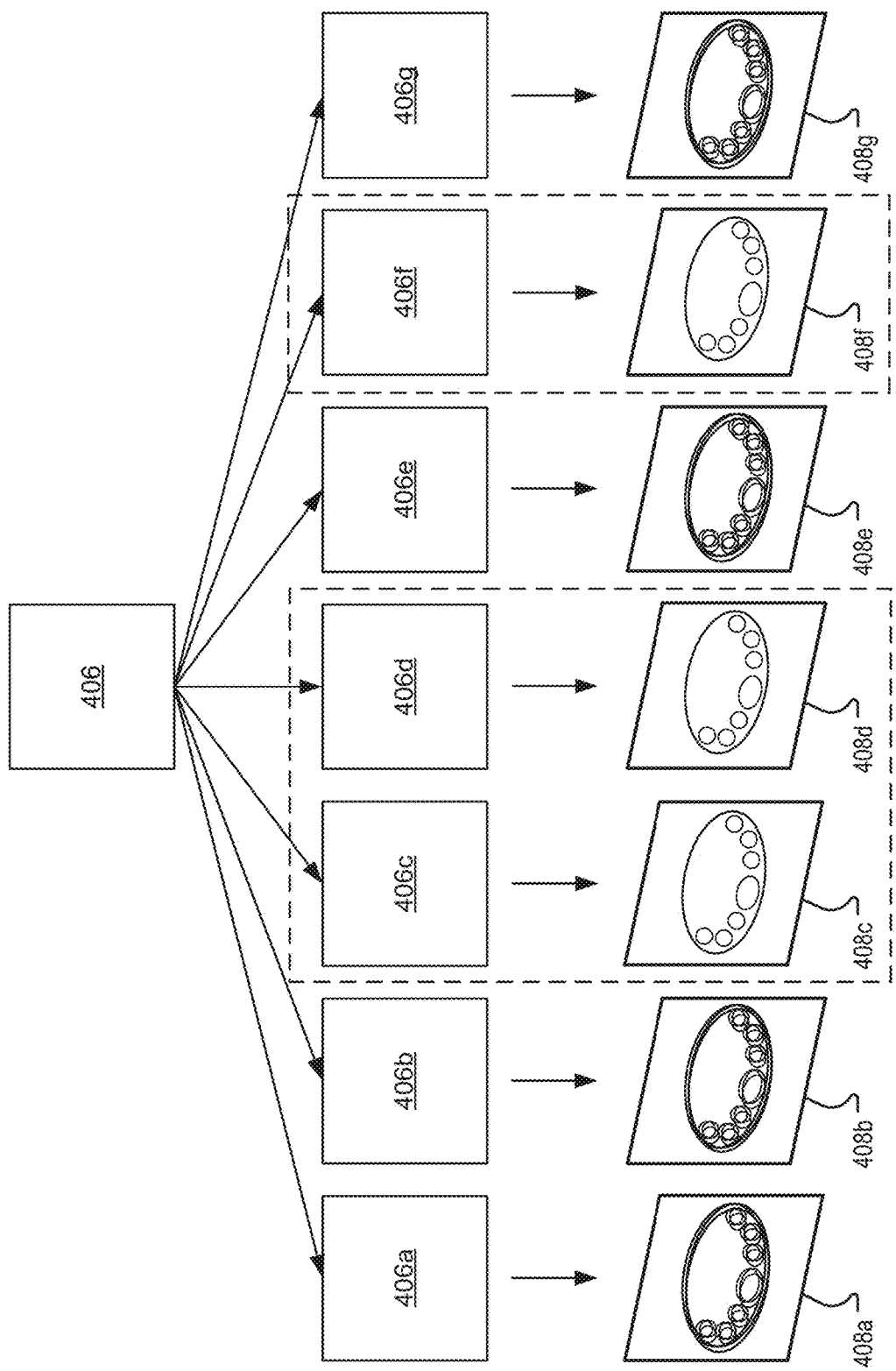
FIG. 4B is a schematic block diagram of a sub process of a method for incremental motion correction, according to an exemplary embodiment of the present disclosure.

Second, with respect to sub process 311 of FIG. 3C, FIG. 4B provides a schematic describing selection of M shots to be used as a first section of k-space, according to an exemplary embodiment of the present disclosure.

It can be appreciated that a MR scan, or a MR image dataset, can include a k-space 406 that comprises N total shots of k-space data. The k-space data of each of the N total shots, described in FIG. 4B as 406a-406g, are time-dependent signals acquired at different spatial frequencies in k-space. A Fourier transform, which may be a 2D Fourier transform, of the N total shots can be computed in order to produce corresponding grayscale images 408a-408g.

As can be appreciated from FIG. 4B, and assuming the grayscale images 408a-408g are ordered chronologically from left to right, a first M shots of the N total shots of the k-space may not have minimal motion, as is desired for the first section of k-space. Accordingly, as in sub process 311 of FIG. 3C, a motion score can be calculated for each shot of the N total shots of the k-space, the N total shots can be ranked, accordingly (not shown), and M shots can be selected as the first section of k-space. In FIG. 4B, the selected M shots are indicated by the dashed blocks surrounding 406c and 408c, 406d and 408d, and 406f and 408f, which are ranked as having lowest motion scores. In an example, the lowest motion scores may be defined as D shots having motion scores within 1.5% of a shot of the k-space determined to have a minimal motion score. From the illustrations, it can be appreciated that the selected M shots that comprise the first section of k-space do not need to be acquired within a specific time window of the MR scan, but can be any shots from the N total shots that satisfy the motion score requirements.

Figure 5:
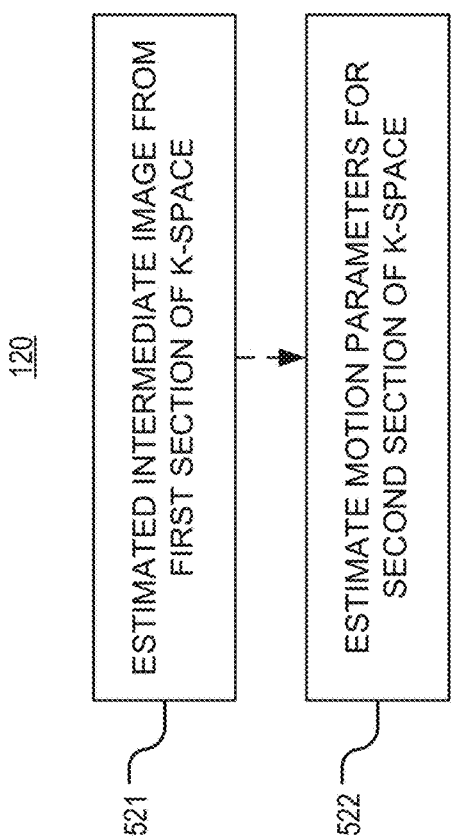
FIG. 5 is a flow diagram of a sub process of a method for incremental motion correction, according to an exemplary embodiment of the present disclosure.

Turning now to FIG. 5, a description of sub process 120 of method 100 will be provided. First, the intermediate image estimated according to the first section of k-space selected at sub process 120 of method 100 can be obtained at step 521 of sub process 120. Subsequently, the motion parameters for a second section of k-space can be estimated at step 522 of sub process 120. In an embodiment, the second section of k-space can be one or more shots of the N total shots of the k-space of the acquired MR scan. In an example, the second section of k-space is a subsequent shot of the N total shots of the k-space.

As described above, the motion parameters of the second section of k-space data can be estimated at step 522 of sub process 120 as $$\hat{T}_i = \min_T \|A_i FST \hat{X}_M - y_i\|_2^2 \quad (3)$$

where $y_i$ is the k-space data for the second section of k-space, or shot i, $A_i$ is the sampling matrix for PE lines acquired in shot i, T is the matrix of motion parameters, and $\hat{T}_i$, which is to be solved for, is the estimated motion parameters for shot i (i.e., the second section of k-space). The estimation of Equation (3) can be performed by, for instance, Levenberg-Marquardt or another method such as Newton's.

Figure 6:
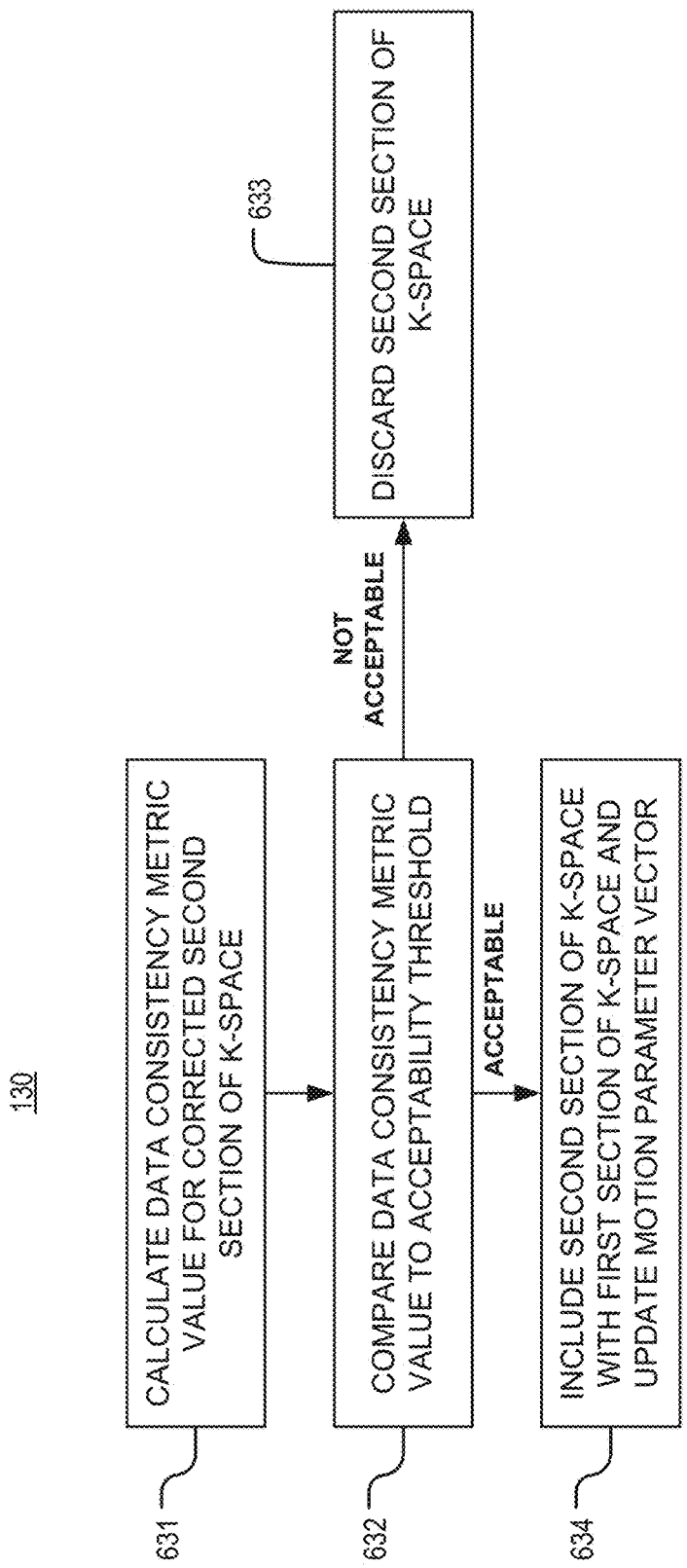
FIG. 6 is a flow diagram of a sub process of a method for incremental motion correction, according to an exemplary embodiment of the present disclosure.

Turning now to FIG. 6, and having estimated motion parameters for the data from the second section of k-space at sub process 120 of method 100, combining data from the first section of k-space and the data from the second section of k-space will be described in view of sub process 130 of method 100.

At a high-level, sub process 130 of method 100 evaluates whether motion present in the second section of k-space is above a level considered to be beneficial to a final image that includes data therein.

Thus, at step 631 of sub process 130, a data consistency metric value may be calculated for the second section of k-space. In an embodiment, and as in view of FIG. 3D, the data consistency metric may a data consistency error value such as the l2-norm of the difference between the acquired data and the data projected by the forward model (i.e., Equation (3)) that includes the estimated motion values of the second section of k-space.

At step 632 of sub process 130, the calculated data consistency metric value may be compared to an acceptability threshold. In an embodiment, the threshold of acceptability may be a predefined percentage (e.g. <1%, <2%, <3%, <4%, <5%, <7.5%, <10%, etc.) of deviation from a shot, or a section, of k-space having a minimal data consistency metric value. In an example, and in view of FIG. 3D, the threshold of acceptability may be a predefined percentage (e.g. <1%, <2%, <3%, <4%, <5%, <7.5%, <10%, etc.), or other statistic, defining a level of error within the forward model (i.e., Equation (3)).

In other words, if it is determined that the motion within the second section of k-space is sufficient to render the final image as having poorer quality, then the data from the second section of k-space should be discarded. Accordingly, if it is determined the data from the second section of k-space does not satisfy the threshold of acceptability at step 632 of sub process 130, the second section of k-space can be discarded at step 633 of sub process 130 and a subsequent section of k-space can be considered again at sub process 110 of method 100, if available. Alternatively, if it is determined the data of the second section of k-space does satisfy the acceptability threshold at step 632 of sub process 130, the data of the second section of k-space can be included with the first section of k-space and the vector of motion parameters can be updated at step 634 of sub process 130. In other words, when the second section of k-space is acceptable, $\hat{T}_{all}(i) = \hat{T}_i$, wherein $\hat{T}_i$ includes the estimated motion parameters of the second section of k-space.

In either outcome, the result of sub process 130 of method 100 can be passed to step 140 of method 100 and a determination can be made of whether additional sections of k-space should be considered. In the case of a chronological ordering of k-space data, it may be that additional shots of the k-space should be evaluated at sub process 110 of method 100. Similarly, in the case of a motion-based ranking of the k-space data, it may be that additional shots of the k-space may improve quality of the final image and should be evaluated at sub process 110 of method 100.

Ultimately, when it is determined at step 140 of method 100 that no additional sections of k-space data can improve the quality of a final image, method 100 proceeds to step 150 and a final reconstructed image can be generated.

FIG. 7 provides illustrations that demonstrate the functionality of method 100 when applied to simulated high motion cases. For instance, using a true image 755 as a reference, it can be appreciated that an estimate without motion correction 756, an estimate with simultaneous correction of all shots 757, and an estimate with incremental correction of N total shots 758, as described in the present disclosure, provide distinctly different outcomes. Moreover, it can be appreciated that the methods of the present disclosure generate a final reconstruction image 758 that most closely resembles the true image 755.

Figure 8:
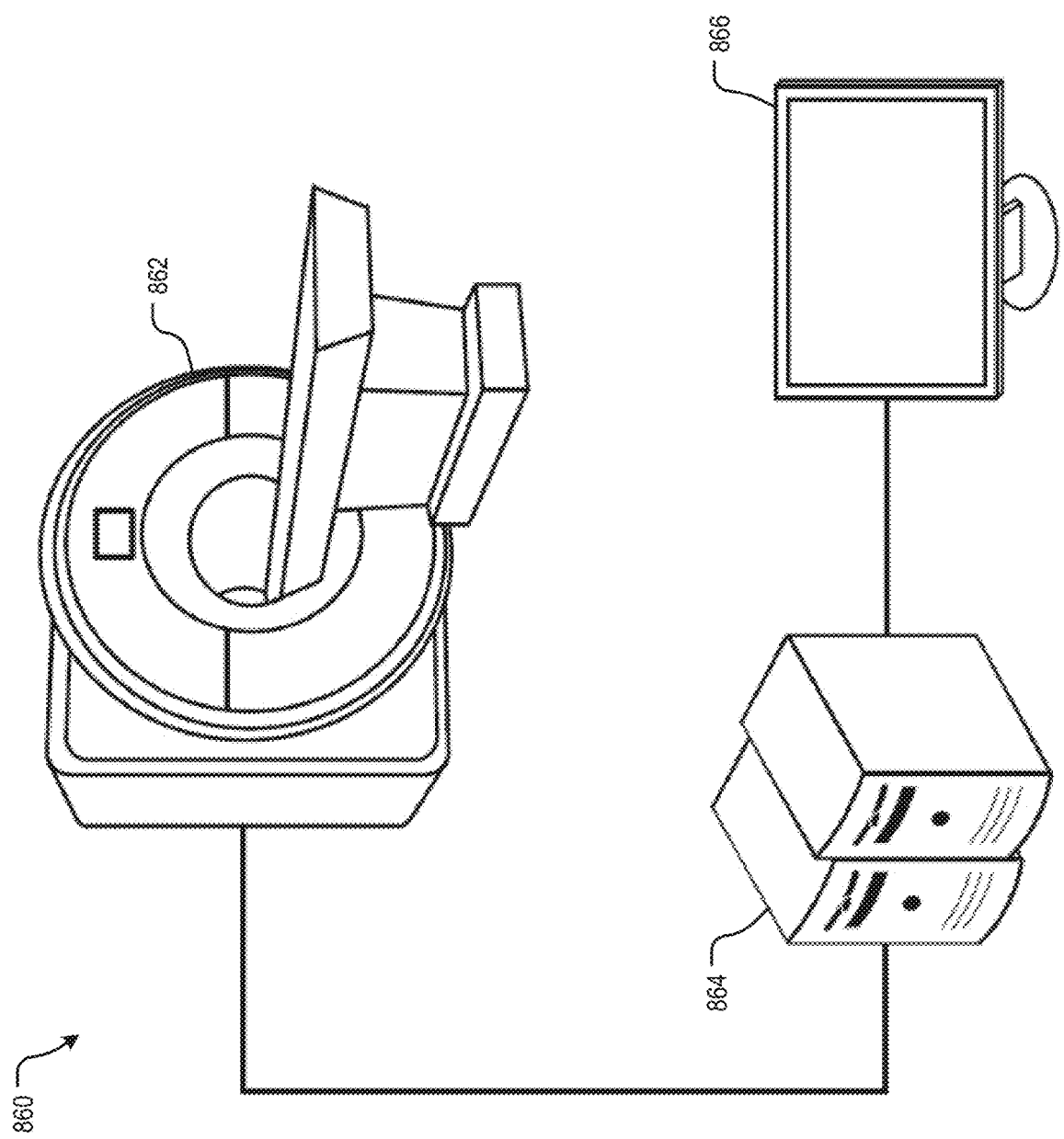
FIG. 8 is an illustration of a medical imaging system configured to implement a method of incremental motion correction, according to an exemplary embodiment of the present disclosure.

FIG. 8 illustrates an example embodiment of a medical-imaging system 860 within which method 100 of the present disclosure can be implemented. The medical-imaging system 860 includes at least one scanning device 862, one or more image-generation devices 864, each of which is a specially-configured computing device (e.g., a specially-configured desktop computer, a specially-configured laptop computer, a specially-configured server), and a display device 866.

The scanning device 862 is configured to acquire scan data by scanning a region (e.g., area, volume, slice) of an object (e.g., a patient). The scanning modality may be, for example, magnetic resonance imaging (MRI), computed tomography (CT), positron emission tomography (PET), X-ray radiography, and ultrasonography.

The one or more image-generation devices 864 obtain scan data from the scanning device 862 and generate an image of the region of the object based on the scan data. To generate the image, for example during intermediate image generation or during final image reconstruction, the one or more image-generation devices 864 may perform a reconstruction process on the scan data. Examples of reconstruction processes include GRAPPA, CG-SENSE, SENSE, ARC, SPIRiT, and LORAKS.

In an embodiment, after the one or more image-generation devices 864 generate the image, the one or more image-generation devices 864 send the image to the display device 864, which displays the image.

In another embodiment, and further to the above, the one or more image-generation devices 864 may generate two images from the same scan data. The one or more image-generation devices 864 may use different reconstruction processes to generate the two images from the same scan data, and one image may have a lower resolution than the other image. Additionally, the one or more image-generation devices 864 may generate an image.

Figure 9:
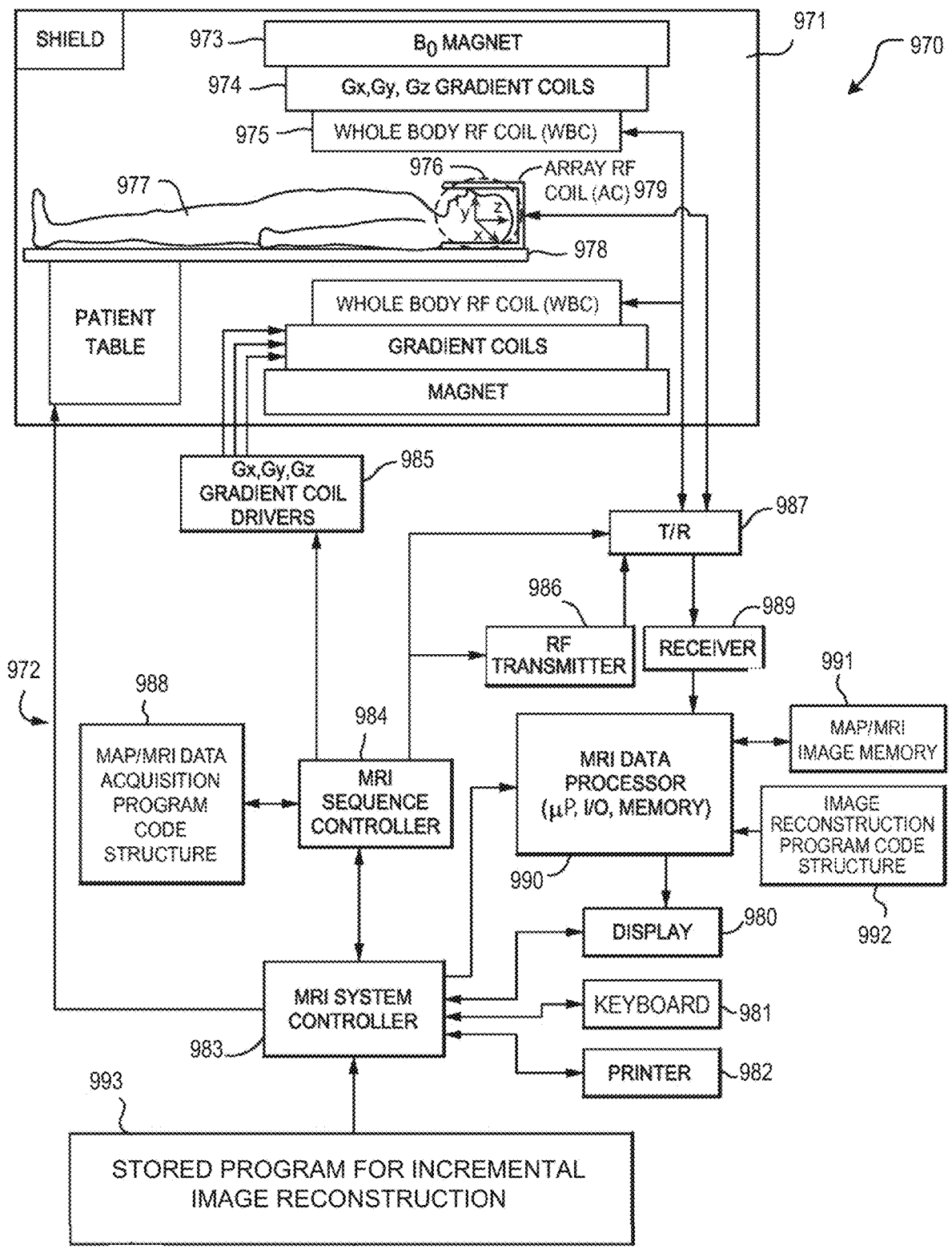
FIG. 9 is a schematic block diagram of a magnetic resonance imaging system, according to an exemplary implementation of the present disclosure.

Referring now to FIG. 9, a non-limiting example of a magnetic resonance imaging (MRI) system 970 is shown. The MRI system 970 depicted in FIG. 9 includes a gantry 971 (shown in a schematic cross-section) and various related system components 972 interfaced therewith. At least the gantry 971 is typically located in a shielded room. The MRI system geometry depicted in FIG. 9 includes a substantially coaxial cylindrical arrangement of the static field $B_0$ magnet 973, a Gx, Gy, and Gz gradient coil set 974, and a large whole-body RF coil (WBC) assembly 975. Along a horizontal axis of this cylindrical array of elements is an imaging volume 976 shown as substantially encompassing the head of a patient 977 supported by a patient table 978.

One or more smaller array RF coils 979 can be more closely coupled to the patient's head (referred to herein, for example, as "scanned object" or "object") in imaging volume 976. As those in the art will appreciate, compared to the WBC (whole-body coil), relatively small coils and/or arrays, such as surface coils or the like, are often customized for particular body parts (e.g., arms, shoulders, elbows, wrists, knees, legs, chest, spine, etc.). Such smaller RF coils are referred to herein as array coils (AC) or phased-array coils (PAC). These can include at least one coil configured to transmit RF signals into the imaging volume, and a plurality of receiver coils configured to receive RF signals from an object, such as the patient's head, in the imaging volume 976.

The MRI system 970 includes a MRI system controller 983 that has input/output ports connected to a display 980, a keyboard 981, and a printer 982. As will be appreciated, the display 980 can be of the touch-screen variety so that it provides control inputs as well. A mouse or other I/O device(s) can also be provided.

The MRI system controller 983 interfaces with a MRI sequence controller 984, which, in turn, controls the Gx, Gy, and Gz gradient coil drivers 985, as well as the RF transmitter 986, and the transmit/receive switch 987 (if the same RF coil is used for both transmission and reception). The MRI sequence controller 984 includes suitable program code structure 988 for implementing MRI imaging (also known as nuclear magnetic resonance, or NMR, imaging) techniques including parallel imaging. MRI sequence controller 984 can be configured for MR imaging with or without parallel imaging. Moreover, the MRI sequence controller 984 can facilitate one or more preparation scan (pre-scan) sequences, and a scan sequence to obtain a main scan magnetic resonance (MR) image (referred to as a diagnostic image). MR data from pre-scans can be used, for example, to determine sensitivity maps for RF coils 975 and/or 979 (sometimes referred to as coil sensitivity maps or spatial sensitivity maps), and to determine unfolding maps for parallel imaging.

The MRI system components 972 include an RF receiver 989 providing input to data processor 990 so as to create processed image data, which is sent to display 980. The MRI data processor 990 is also configured to access previously generated MR data, images, and/or maps, such as, for example, coil sensitivity maps, parallel image unfolding maps, distortion maps and/or system configuration parameters 991, and MRI image reconstruction program code structures 992 and 993.

In one embodiment, the MRI data processor 990 includes processing circuitry. The processing circuitry can include devices such as an application-specific integrated circuit (ASIC), configurable logic devices (e.g., simple programmable logic devices (SPLDs), complex programmable logic devices (CPLDs), and field programmable gate arrays (FPGAs), and other circuit components that are arranged to perform the functions recited in the present disclosure.

The processor 990 executes one or more sequences of one or more instructions, such as method 100 described herein, contained in the program code structures 992 and 993. Alternatively, the instructions can be read from another computer-readable medium, such as a hard disk or a removable media drive. One or more processors in a multi-processing arrangement can also be employed to execute the sequences of instructions contained in the program code structures 992 and 993. In alternative embodiments, hard-wired circuitry can be used in place of or in combination with software instructions. Thus, the disclosed embodiments are not limited to any specific combination of hardware circuitry and software.

Additionally, the term "computer-readable medium" as used herein refers to any non-transitory medium that participates in providing instructions to the processor 990 for execution. A computer readable medium can take many forms, including, but not limited to, non-volatile media or volatile media. Non-volatile media includes, for example, optical, magnetic disks, and magneto-optical disks, or a removable media drive. Volatile media includes dynamic memory.

Also illustrated in FIG. 9, and as referenced above, is a generalized depiction of an MRI system program storage (memory) 993, where stored program code structures are stored in non-transitory computer-readable storage media accessible to the various data processing components of the MRI system 970. As those in the art will appreciate, the program store 993 can be segmented and directly connected, at least in part, to different ones of the system 972 processing computers having most immediate need for such stored program code structures in their normal operation (i.e., rather than being commonly stored and connected directly to the MRI system controller 983).

Additionally, the MRI system 970 as depicted in FIG. 9 can be utilized to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Furthermore, not only does the physical state of the processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes an image reconstruction map (e.g., coil sensitivity map, unfolding map, ghosting map, a distortion map etc.) generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure, as does a particular structure of computer control program codes that, when sequentially loaded into instruction registers and executed by one or more CPUs of the MRI system 970, causes a particular sequence of operational states to occur and be transitioned through within the MRI system 970.

Obviously, numerous modifications and variations are possible in light of the above teachings. It is therefore to be understood that within the scope of the appended claims, the invention may be practiced otherwise than as specifically described herein.

Embodiments of the present disclosure may also be as set forth in the following parentheticals.

(1) An apparatus for incremental motion correction in magnetic resonance imaging, the apparatus comprising processing circuitry configured to estimate an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion, estimate motion parameters of a second section of the k-space using the estimated intermediate image, combine data from the first section of the k-space with data from the second section of the k-space according to the estimated motion parameters, and reconstruct the combined data of the k-space to generate a final image.

(2) The apparatus according to (1), wherein the processing circuitry is further configured to order N shots of the k-space of the magnetic resonance scan chronologically, and select, as the first section of the k-space, a first M shots of the ordered N shots of the k-space of the magnetic resonance scan.

(3) The apparatus according to either (1) or (2), wherein the processing circuitry is further configured to calculate a motion score for each of N shots of the k-space of the magnetic resonance scan, rank the N shots of the k-space of the magnetic resonance scan according to the calculated motion score for each of the N shots of the k-space, the ranked N shots being acquired over a full time period of the magnetic resonance scan, and select, as the first section of the k-space, a section of the k-space that includes a highest ranked shot of the N shots of the k-space and at least one other of the ranked N shots.

(4) The apparatus according to any one of (1) to (3), wherein the processing circuitry is further configured to update a vector of motion parameters to include the estimated motion parameters of the second section of the k-space, the vector of motion parameters including motion parameters corresponding to the first section of the k-space.

(5) The apparatus according to any one of (1) to (4), wherein the processing circuitry is further configured to reconstruct the combined data of the k-space to generate the final image based on the updated vector of motion parameters.

(6) The apparatus according to any one of (1) to (5), wherein the vector of motion parameters includes, for each combined section of the k-space, two translational values and one rotational value.

(7) The apparatus according to any one of (1) to (6), wherein the processing circuitry is further configured to combine the data from the first section of the k-space with the data from the second section of the k-space according to the estimated motion parameters by calculating a value of a data consistency metric for the second section of the k-space, and discarding, when a comparison indicates the calculated value of the data consistency metric is below a threshold of acceptability, the data from the second section of the k-space.

(8) The apparatus according to any one of (1) to (7), wherein the processing circuitry is further configured to calculate a data consistency error value for each of N shots of the k-space of the magnetic resonance scan, and select the first section of the k-space based on the data consistency error values calculated for each of the N shots of the k-space of the magnetic resonance scan.

(9) A method for incremental motion correction in magnetic resonance imaging, comprising estimating, by processing circuitry, an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion, estimating, by the processing circuitry, motion parameters of a second section of the k-space using the estimated intermediate image, combining, by the processing circuitry, data from the first section of the k-space with data from the second section of the k-space according to the estimated motion parameters, and reconstructing, by the processing circuitry, the combined data of the k-space to generate a final image.

(10) The method according to (9), further comprising ordering, by the processing circuitry, N shots of the magnetic resonance scan chronologically, and selecting, by the processing circuitry and as the first section of the k-space, a first M shots of the ordered N shots of the magnetic resonance scan.

(11) The method according to either (9) or (10), further comprising calculating, by the processing circuitry, a motion score for each of N shots of the magnetic resonance scan, ranking, by the processing circuitry, the N shots of the magnetic resonance scan according to the calculated motion score for each of the N shots, the ranked N shots being acquired over a full time period of the magnetic resonance scan, and selecting, by the processing circuitry and as the first section of the k-space, a section of the k-space that includes a highest ranked shot of the N shots of the k-space and at least one other of the ranked N shots.

(12) The method according to any one of (9) to (11), further comprising updating, by the processing circuitry, a vector of motion parameters to include the estimated motion parameters of the second section of the k-space, the vector of motion parameters including motion parameters corresponding to the first section of the k-space.

(13) The method according to any one of (9) to (12), wherein the reconstructing the combined data of the k-space to generate the final image is based on the updated vector of motion parameters.

(14) The method according to any one of (9) to (13), wherein the updated vector of motion parameters includes, for each combined section of the k-space, two translational values and one rotational value.

(15) The method according to any one of (9) to (14), wherein the combining the data from the first section of the k-space with the data from the second section of the k-space according to the estimated motion parameters includes calculating, by the processing circuitry, a value of a data consistency metric for the second section of the k-space, and discarding, by the processing circuitry and when a comparison indicates the calculated value of the data consistency metric is below a threshold of acceptability, the data from the second section of the k-space.

(16) A non-transitory computer-readable storage medium storing computer-readable instructions that, when executed by a computer, cause the computer to perform a method for incremental motion correction in magnetic resonance imaging, comprising estimating an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion, estimating motion parameters of a second section of the k-space using the estimated intermediate image, combining data from the first section of the k-space with data from the second section of the k-space according to the estimated motion parameters, and reconstructing the combined data of the k-space to generate a final image.

(17) The non-transitory computer-readable storage medium according to (16), further comprising ordering N shots of the magnetic resonance scan chronologically, and selecting, as the first section of the k-space, a first M shots of the ordered N shots of the magnetic resonance scan.

(18) The non-transitory computer-readable storage medium according to either (16) or (17), further comprising calculating a motion score for each of N shots of the magnetic resonance scan, ranking the N shots of the magnetic resonance scan according to the calculated motion score for each of the N shots, the ranked N shots being acquired over a full time period of the magnetic resonance scan, and selecting, as the first section of the k-space, a section of the k-space that includes a highest ranked shot of the N shots of the k-space and at least one other of the ranked N shots.

(19) The non-transitory computer-readable storage medium according to any one of (16) to (18), further comprising updating a vector of motion parameters to include the estimated motion parameters of the second section of the k-space, the vector of motion parameters including motion parameters corresponding to the first section of the k-space.

(20) The non-transitory computer-readable storage medium according to any one of (16) to (19), wherein the combining the data from the first section of the k-space with the data from the second section of the k-space according to the estimated motion parameters includes calculating a value of a data consistency metric for the second section of the k-space, and discarding, when the comparison indicates the calculated value of the data consistency metric is below a threshold of acceptability, the data from the second section of the k-space.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. An apparatus for incremental motion correction in magnetic resonance imaging, the apparatus comprising:
   processing circuitry configured to
      estimate an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion,
      estimate motion parameters of a second section of the k-space using the estimated intermediate image,
      combine data from the first section of the k-space with data from the second section of the k-space according to the estimated motion parameters, and
      reconstruct the combined data of the k-space to generate a final image.

2. The apparatus according to claim 1, wherein the processing circuitry is further configured to
   order N shots of the k-space of the magnetic resonance scan chronologically, and
   select, as the first section of the k-space, a first M shots of the ordered N shots of the k-space of the magnetic resonance scan.

3. The apparatus according to claim 1, wherein the processing circuitry is further configured to
   calculate a motion score for each of N shots of the k-space of the magnetic resonance scan,
   rank the N shots of the k-space of the magnetic resonance scan according to the calculated motion score for each of the N shots of the k-space, the ranked N shots being acquired over a full time period of the magnetic resonance scan, and select, as the first section of the k-space, a section of the k-space that includes a highest ranked shot of the N shots of the k-space and at least one other of the ranked N shots.

4. The apparatus according to claim 1, wherein the processing circuitry is further configured to
update a vector of motion parameters to include the estimated motion parameters of the second section of the k-space, the vector of motion parameters including motion parameters corresponding to the first section of the k-space.

5. The apparatus according to claim 4, wherein the processing circuitry is further configured to reconstruct the combined data of the k-space to generate the final image based on the updated vector of motion parameters.

6. The apparatus according to claim 4, wherein the vector of motion parameters includes, for each combined section of the k-space, two translational values and one rotational value.

7. The apparatus according to claim 1, wherein the processing circuitry is further configured to combine the data from the first section of the k-space with the data from the second section of the k-space according to the estimated motion parameters by
calculating a value of a data consistency metric for the second section of the k-space, and
discarding, when a comparison indicates the calculated value of the data consistency metric is below a threshold of acceptability, the data from the second section of the k-space.

8. The apparatus according to claim 1, wherein the processing circuitry is further configured to
calculate a data consistency error value for each of N shots of the k-space of the magnetic resonance scan, and
select the first section of the k-space based on the data consistency error values calculated for each of the N shots of the k-space of the magnetic resonance scan.

9. A method for incremental motion correction in magnetic resonance imaging, comprising:
estimating, by processing circuitry, an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion;
estimating, by the processing circuitry, motion parameters of a second section of the k-space using the estimated intermediate image;
combining, by the processing circuitry, data from the first section of the k-space with data from the second section of the k-space according to the estimated motion parameters; and
reconstructing, by the processing circuitry, the combined data of the k-space to generate a final image.

10. The method according to claim 9, further comprising
ordering, by the processing circuitry, N shots of the magnetic resonance scan chronologically, and
selecting, by the processing circuitry and as the first section of the k-space, a first M shots of the ordered N shots of the magnetic resonance scan.

11. The method according to claim 9, further comprising
calculating, by the processing circuitry, a motion score for each of N shots of the magnetic resonance scan,
ranking, by the processing circuitry, the N shots of the magnetic resonance scan according to the calculated motion score for each of the N shots, the ranked N shots being acquired over a full time period of the magnetic resonance scan, and
selecting, by the processing circuitry and as the first section of the k-space, a section of the k-space that includes a highest ranked shot of the N shots of the k-space and at least one other of the ranked N shots.

12. The method according to claim 9, further comprising
updating, by the processing circuitry, a vector of motion parameters to include the estimated motion parameters of the second section of the k-space, the vector of motion parameters including motion parameters corresponding to the first section of the k-space.

13. The method according to claim 12, wherein the reconstructing the combined data of the k-space to generate the final image is based on the updated vector of motion parameters.

14. The method according to claim 12, wherein the updated vector of motion parameters includes, for each combined section of the k-space, two translational values and one rotational value.

15. The method according to claim 9, wherein the combining the data from the first section of the k-space with the data from the second section of the k-space according to the estimated motion parameters includes
calculating, by the processing circuitry, a value of a data consistency metric for the second section of the k-space, and
discarding, by the processing circuitry and when a comparison indicates the calculated value of the data consistency metric is below a threshold of acceptability, the data from the second section of the k-space.

16. A non-transitory computer-readable storage medium storing computer-readable instructions that, when executed by a computer, cause the computer to perform a method for incremental motion correction in magnetic resonance imaging, comprising:
estimating an intermediate image from a first section of k-space, the first section of the k-space corresponding to acquisition time points within a magnetic resonance scan of a subject, the corresponding acquisition time points within the magnetic resonance scan being associated with shots of the k-space determined to have minimal motion;
estimating motion parameters of a second section of the k-space using the estimated intermediate image;
combining data from the first section of the k-space with data from the second section of the k-space according to the estimated motion parameters; and
reconstructing the combined data of the k-space to generate a final image.

17. The non-transitory computer-readable storage medium according to claim 16, further comprising
ordering N shots of the magnetic resonance scan chronologically, and
selecting, as the first section of the k-space, a first M shots of the ordered N shots of the magnetic resonance scan.

18. The non-transitory computer-readable storage medium according to claim 16, further comprising
calculating a motion score for each of N shots of the magnetic resonance scan,
ranking the N shots of the magnetic resonance scan according to the calculated motion score for each of the N shots, the ranked N shots being acquired over a full time period of the magnetic resonance scan, and selecting, as the first section of the k-space, a section of the k-space that includes a highest ranked shot of the N shots of the k-space and at least one other of the ranked N shots.

19. The non-transitory computer-readable storage medium according to claim 16, further comprising
updating a vector of motion parameters to include the estimated motion parameters of the second section of the k-space, the vector of motion parameters including motion parameters corresponding to the first section of the k-space.

20. The non-transitory computer-readable storage medium according to claim 16, wherein the combining the data from the first section of the k-space with the data from the second section of the k-space according to the estimated motion parameters includes
calculating a value of a data consistency metric for the second section of the k-space, and
discarding, when the comparison indicates the calculated value of the data consistency metric is below a threshold of acceptability, the data from the second section of the k-space.

\* \* \* \* \*